(12) United States Patent
Seo et al.

(10) Patent No.: US 11,450,540 B2
(45) Date of Patent: Sep. 20, 2022

(54) APPARATUS AND METHOD FOR TREATING SUBSTRATE

(71) Applicant: SEMES CO., LTD., Cheonan-si (KR)

(72) Inventors: Donghyuk Seo, Cheonan-si (KR); Sung Yong Lee, Anyang-si (KR)

(73) Assignee: Semes Co., Ltd., Chungcheongnam-do (KR)

(*) Notice: Subject to any disclaimer, the term of this patent is extended or adjusted under 35 U.S.C. 154(b) by 303 days.

(21) Appl. No.: 16/886,321

(22) Filed: May 28, 2020

(65) Prior Publication Data

US 2020/0381279 A1    Dec. 3, 2020

(30) Foreign Application Priority Data

May 29, 2019   (KR) .................... 10-2019-0063000

(51) Int. Cl.
*H01L 21/67*   (2006.01)
*G03F 7/20*    (2006.01)
*H05B 1/02*    (2006.01)

(52) U.S. Cl.
CPC .... *H01L 21/67248* (2013.01); *G03F 7/70858* (2013.01); *H01L 21/67103* (2013.01); *H05B 1/0233* (2013.01)

(58) Field of Classification Search
CPC ......... H01L 21/67248; H01L 21/67103; H01L 21/67178; H01L 21/67288; H01L 21/67098; H01L 21/02; G03F 7/70858; H05B 1/0233; H05B 2203/014; H05B 3/283; G01K 3/06

See application file for complete search history.

(56) References Cited

U.S. PATENT DOCUMENTS

| | | | |
|---|---|---|---|
| 10,923,369 B2* | 2/2021 | Koizumi | H01L 21/67248 |
| 2009/0060480 A1* | 3/2009 | Herchen | F27B 17/0025 |
| | | | 219/390 |
| 2013/0175323 A1* | 7/2013 | Zhang | B23K 1/0016 |
| | | | 228/4.1 |
| 2021/0204364 A1* | 7/2021 | Huang | H05B 1/0272 |

FOREIGN PATENT DOCUMENTS

| | | |
|---|---|---|
| JP | H10-116885 A | 5/1998 |
| KR | 10-2015-0146038 A | 12/2015 |
| KR | 101619094 B1 | 5/2016 |
| KR | 101673839 B1 | 11/2016 |
| KR | 10-2017-0009757 A | 1/2017 |
| KR | 10-2018-0001927 A | 1/2018 |
| KR | 10-2018-0097789 A | 8/2018 |
| KR | 10-2019-0027027 A | 3/2019 |

\* cited by examiner

*Primary Examiner* — Karen Kusumakar
(74) *Attorney, Agent, or Firm* — Harness, Dickey & Pierce, P.L.C.

(57) ABSTRACT

An apparatus for treating a substrate includes a housing having a treatment space therein, a plate that supports the substrate in the housing, a heating unit having a heating wire that is provided inside the plate and that heats the substrate, a main temperature sensor that directly measures temperatures of the plate, and an auxiliary temperature sensor that measures temperatures of the heating wire.

19 Claims, 11 Drawing Sheets

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2019-0063000 filed on May 29, 2019, in the Korean Intellectual Property Office, the entire contents of which are hereby incorporated by reference.

BACKGROUND

Embodiments of the inventive concept described herein relate to an apparatus and method for treating a substrate, and more particularly, relate to a substrate treating apparatus and method for detecting an abnormality in a heating wire.

Various processes, such as photolithography, etching, deposition, ion implantation, cleaning, and the like, are performed to manufacture semiconductor elements. Among these processes, the photolithography process for forming a pattern plays an important role in achieving high density integration of the semiconductor elements.

The photolithography process includes a coating process, an exposing process, and a developing process, and a bake process is performed before and after the exposing process. The bake process is a process of performing heat treatment on a substrate. When the substrate is placed on a heating plate, the heat treatment is performed on the substrate through a heating unit provided inside the heating plate.

In general, the heating unit is implemented with a heating wire. The heating wire used for the heating unit is constituted by a metallic material, a compound thereof, a plating layer, and the like. To perform the heat treatment on the substrate, the heating wire is consistently heated and cooled. The repetition of the heating and the cooling causes repeated expansion and contraction of the metallic material constituting the heating wire and a gradual change in characteristics of the heating wire. As a result, uncertainty about temperature control of a substrate process requiring precision rises due to the change in the characteristics of the heating wire.

SUMMARY

Embodiments of the inventive concept provide a substrate treating apparatus and method for easily detecting an abnormality in a heating wire.

According to an exemplary embodiment, an apparatus for treating a substrate includes a housing having a treatment space therein, a plate that supports the substrate in the housing, a heating unit having a heating wire that is provided inside the plate and that heats the substrate, a main temperature sensor that directly measures temperatures of the plate, and an auxiliary temperature sensor that measures temperatures of the heating wire.

The apparatus may further include an abnormality detection unit that detects an abnormality in the heating wire, based on the temperatures measured by the main temperature sensor and the temperatures measured by the auxiliary temperature sensor.

The abnormality detection unit may determine that the abnormality in the heating wire is detected, when a temperature change characteristic of the temperatures measured by the auxiliary temperature sensor for the temperatures measured by the main temperature sensor exceeds a preset range.

The abnormality detection unit may determine that the abnormality in the heating wire is detected, when an average value of the temperatures measured by the auxiliary temperature sensor exceeds a preset range.

The abnormality detection unit may determine that the abnormality in the heating wire is detected, when a standard deviation of the temperatures measured by the auxiliary temperature sensor exceeds a preset range.

The abnormality detection unit may detect at least one of deformation of the heating wire, poor insulation of the heating wire, and introduction of noise, based on the temperature change characteristic of the temperatures measured by the auxiliary temperature sensor for the temperatures measured by the main temperature sensor.

The heating wire may include a plurality of heating wires located in a plurality of areas of the plate. The main temperature sensor may include a plurality of temperature sensors located in the plurality of areas of the plate, respectively. The auxiliary temperature sensor may measure temperatures of each of the plurality of heating wires located in the plurality of areas of the plate.

The abnormality detection unit may determine that the abnormality in the heating wire is detected in a first area, when a difference between an average value of the temperatures measured by the auxiliary temperature sensor in the first area among the plurality of areas of the plate and an average value of the temperatures measured by the auxiliary temperature sensor in the remaining areas other than the first area among the plurality of areas is larger than a preset value.

The abnormality detection unit may determine that the abnormality in the heating wire is detected in a first area, when a difference between a standard deviation of the temperatures measured by the auxiliary temperature sensor in the first area among the plurality of areas of the plate and a standard deviation of the temperatures measured by the auxiliary temperature sensor in the remaining areas other than the first area among the plurality of areas is larger than a preset value.

The abnormality detection unit may predict a failure in the heating wire by collecting, for a preset period of time, a temperature change characteristic of the temperatures measured by the auxiliary temperature sensor for the temperatures measured by the main temperature sensor.

The heating unit may include a heating wire and a power supply that applies electric current to the heating wire, and the auxiliary temperature sensor may measure the temperatures of the heating wire by using the electric current flowing through the heating wire and voltage of the power supply.

According to an exemplary embodiment, a method for treating a substrate includes directly measuring temperatures of a plate that supports the substrate, measuring temperatures of a heating wire that is provided inside the plate and that heats the substrate, and detecting an abnormality in the heating wire, based on the temperatures of the plate and the temperatures of the heating wire.

The detecting of the abnormality in the heating wire may include determining that the abnormality in the heating wire is detected, when a temperature change characteristic of the heating wire for the temperatures of the plate exceeds a preset range.

The determining that the abnormality in the heating wire is detected may include determining that the abnormality in the heating wire is detected, when an average value of the temperatures of the heating wire exceeds a preset range.

The determining that the abnormality in the heating wire is detected may include determining that the abnormality in the heating wire is detected, when a standard deviation of the temperatures of the heating wire exceeds a preset range.

The determining that the abnormality in the heating wire is detected may include detecting at least one of deformation of the heating wire, poor insulation of the heating wire, and introduction of noise, based on the temperature change characteristic of the heating wire for the temperatures of the plate.

The heating wire may include a plurality of heating wires located in a plurality of areas of the plate, respectively. The measuring of the temperatures of the heating wire may include measuring temperatures of each of the plurality of heating wires located in the plurality of areas of the plate. The detecting of the abnormality in the heating wire may include determining that the abnormality in the heating wire is detected in a first area, when a difference between an average value of the temperatures of the heating wire in the first area among the plurality of areas of the plate and an average value of the temperatures of the heating wire in the remaining areas other than the first area among the plurality of areas is larger than a preset value.

The heating wire may include a plurality of heating wires located in a plurality of areas of the plate, respectively. The measuring of the temperatures of the heating wire may include measuring temperatures of each of the plurality of heating wires located in the plurality of areas of the plate. The detecting of the abnormality in the heating wire may include determining that the abnormality in the heating wire is detected in a first area, when a difference between a standard deviation of the temperatures of the heating wire in the first area among the plurality of areas of the plate and a standard deviation of the temperatures of the heating wire in the remaining areas other than the first area among the plurality of areas is larger than a preset value.

The method may further include predicting a failure in the heating water by collecting a temperature change characteristic of the heating wire for the temperatures of the plate for a preset period of time.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, embodiments of the inventive concept will be described in more detail with reference to the accompanying drawings. Various modifications and variations can be made to embodiments of the inventive concept, and the scope of the inventive concept should not be construed as limited to the embodiments set forth herein. These embodiments are provided so that the inventive concept will be thorough and complete, and will fully convey the scope of the inventive concept to those skilled in the art. Accordingly, in the drawings, the shapes of components are exaggerated for clarity of illustration.

Equipment of this embodiment may be used to perform a photolithography process on a substrate such as a semiconductor wafer or a flat display panel. In particular, the equipment of this embodiment may be connected to a stepper and may be used to perform a coating process and a developing process on a substrate. In the following description, it will be exemplified that a wafer is used as a substrate.

FIGS. 1 to 4 are schematic views illustrating the substrate treating equipment according to the embodiment of the inventive concept.

Referring to FIGS. 1 to 4, the substrate treating equipment 1 includes a load port 100, an index module 200, a first buffer module 300, a coating and developing module 400, a second buffer module 500, a pre/post-exposure treatment module 600, and an interface module 700. The load port 100, the index module 200, the first buffer module 300, the coating and developing module 400, the second buffer module 500, the pre/post-exposure treatment module 600, and the interface module 700 are sequentially disposed in a row in one direction.

Hereinafter, the direction in which the load port 100, the index module 200, the first buffer module 300, the coating and developing module 400, the second buffer module 500, the pre/post-exposure treatment module 600, and the interface module 700 are disposed is referred to as a first direction 12. A direction perpendicular to the first direction 12 when viewed from above is referred to as a second direction 14, and a direction perpendicular to the first direction 12 and the second direction 14 is referred to as a third direction 16.

Substrates W are moved in a state of being received in cassettes 20. The cassettes 20 have a structure that can be sealed from the outside. For example, front open unified pods (FOUPs), each of which has a door at the front, may be used as the cassettes 20.

Hereinafter, the load port 100, the index module 200, the first buffer module 300, the coating and developing module 400, the second buffer module 500, the pre/post-exposure treatment module 600, and the interface module 700 will be described in detail.

Figure 1:
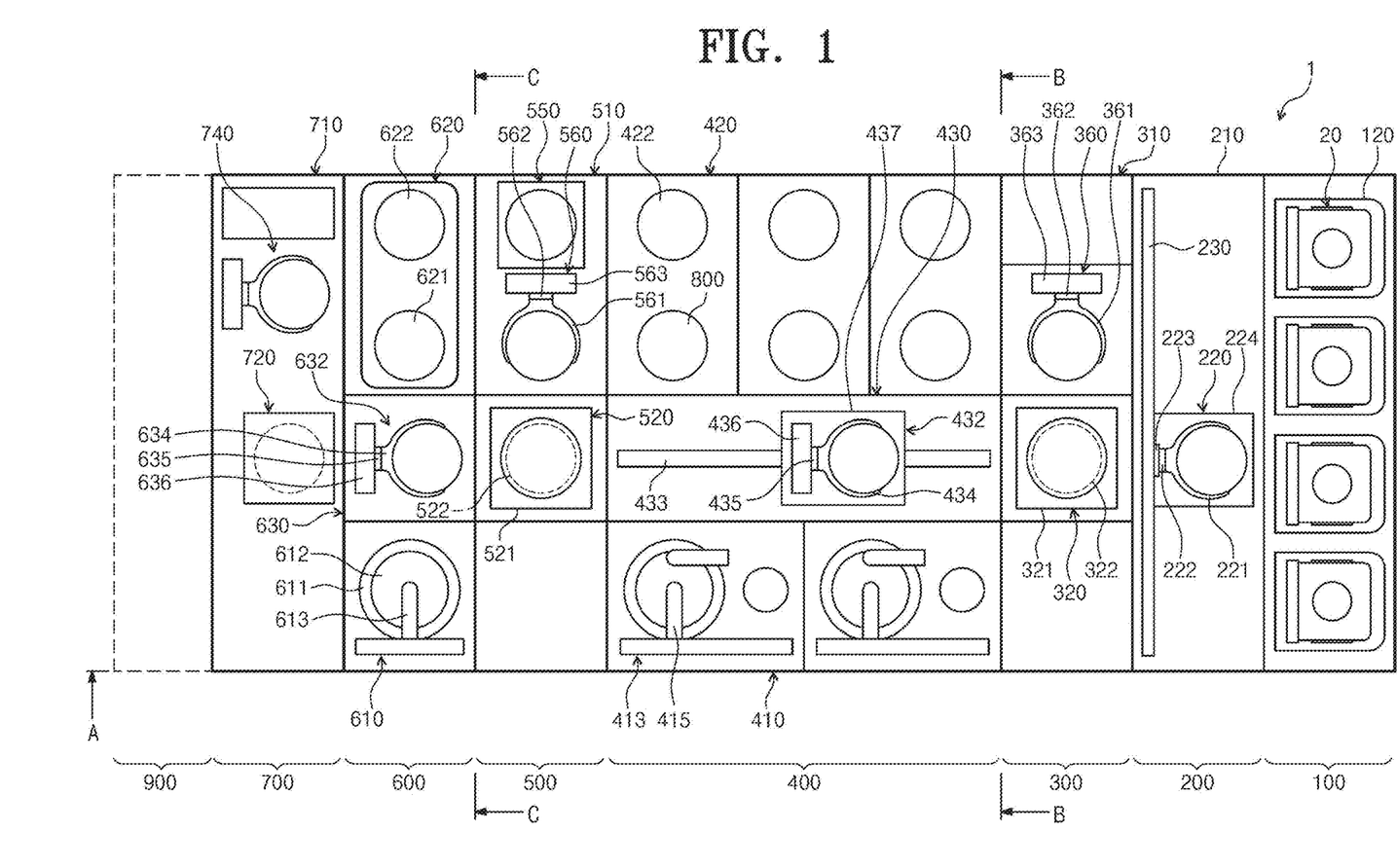
FIG. 1 is a top view illustrating substrate treating equipment.
Figure 2:
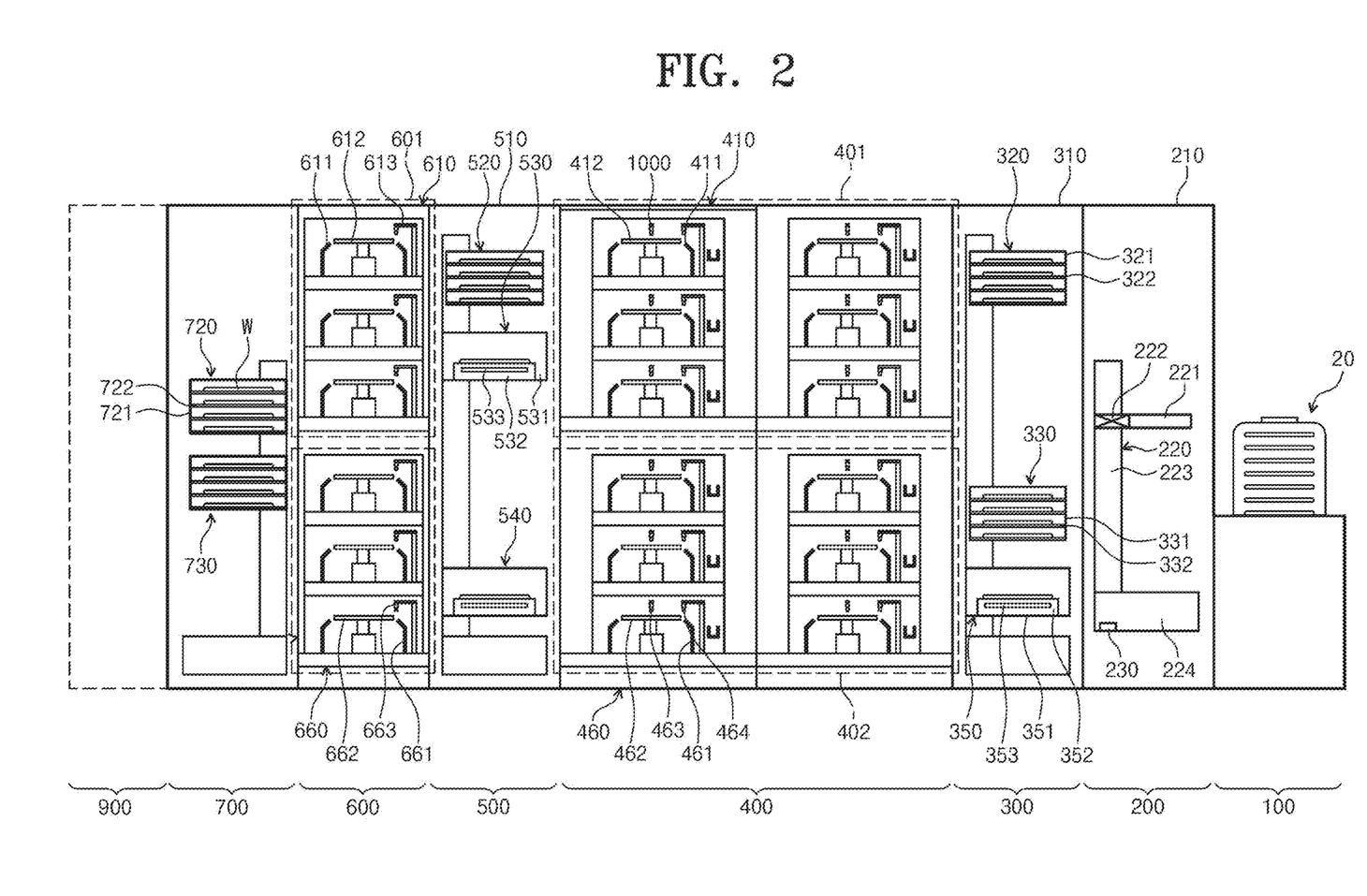
FIG. 2 is a view illustrating the substrate treating equipment of FIG. 1 when viewed in direction A-A.
Figure 3:
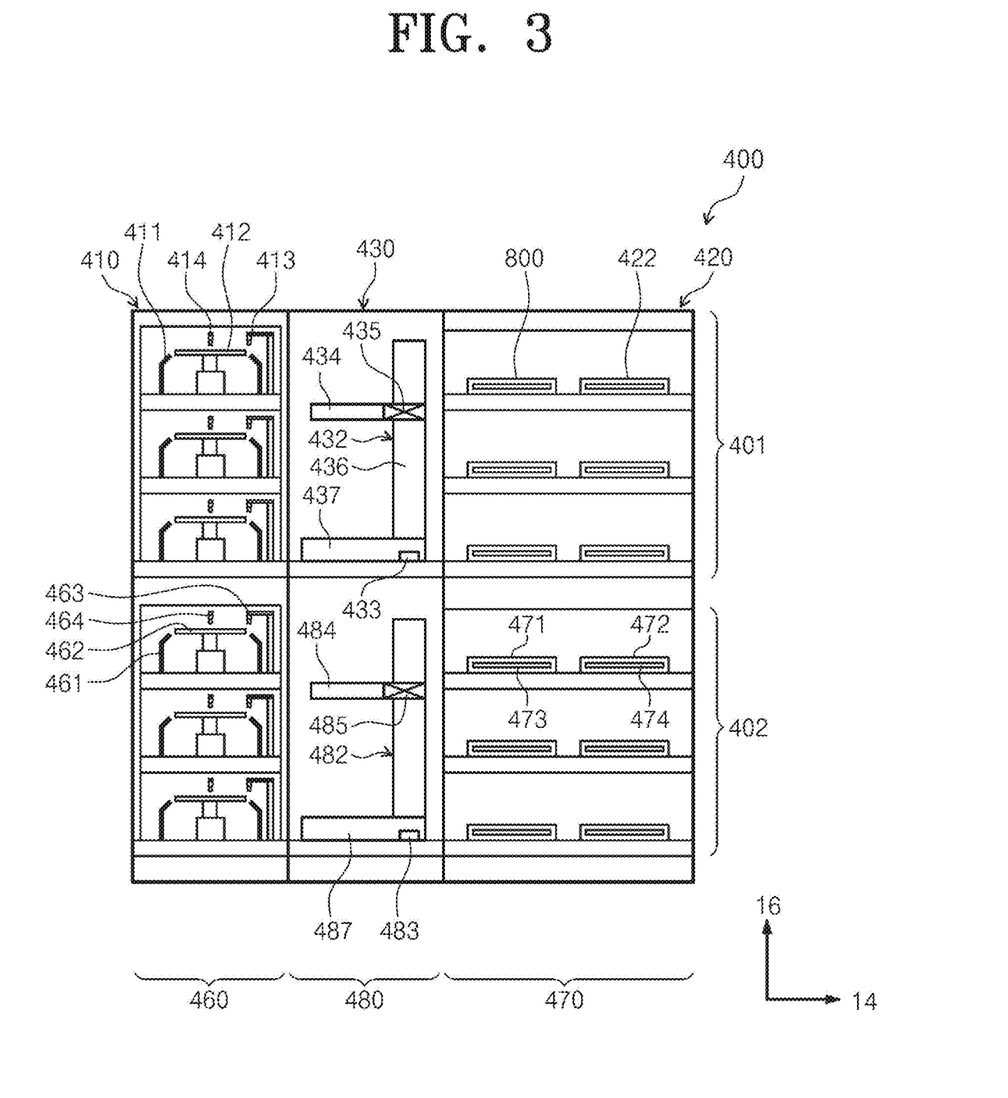
FIG. 3 is a view illustrating the substrate treating equipment of FIG. 1 when viewed in direction B-B.
Figure 4:
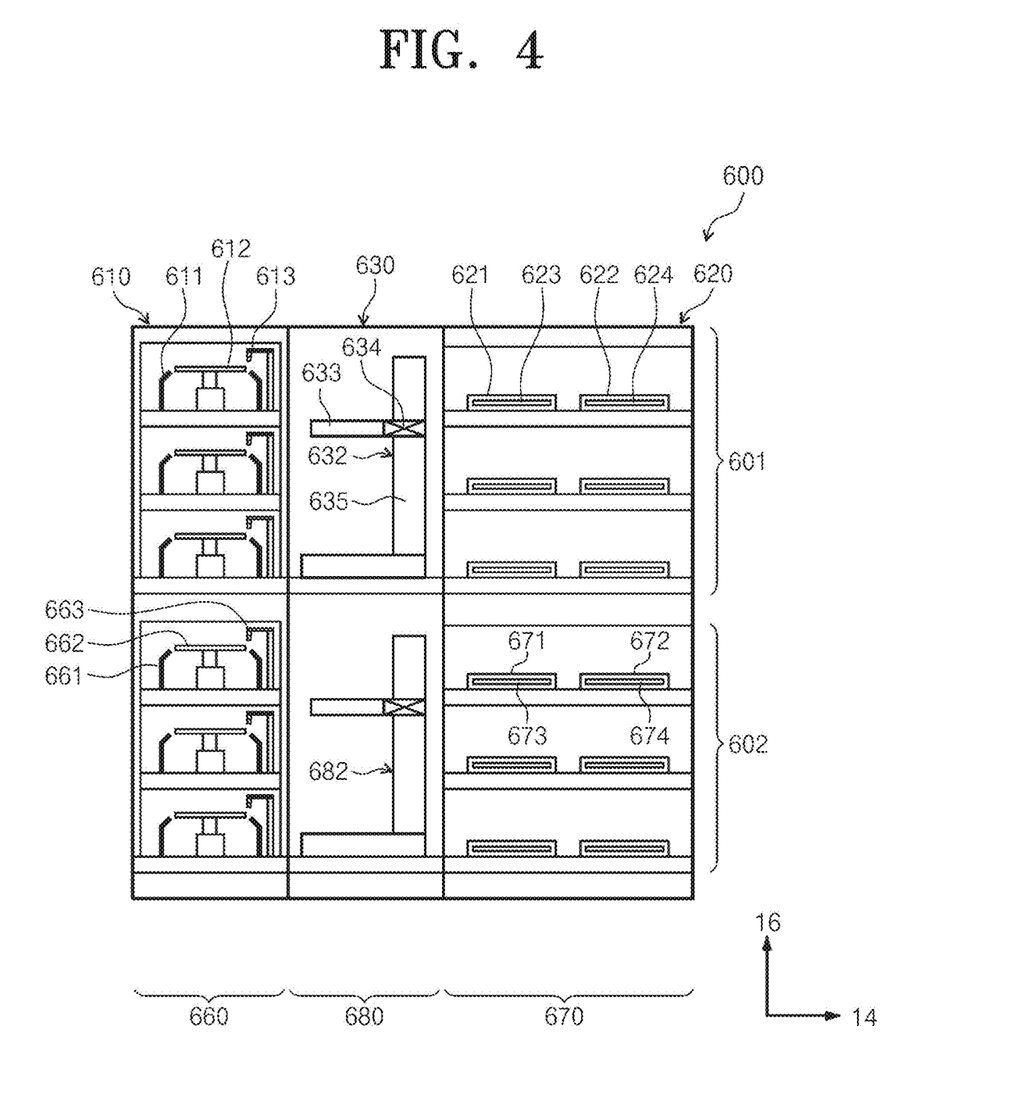
FIG. 4 is a view illustrating the substrate treating equipment of FIG. 1 when viewed in direction C-C.

The load port 100 has mounting tables 120 on which the cassettes 20 having the substrates W received therein are placed. The mounting tables 120 are disposed in a row along the second direction 14. In FIG. 1, four mounting tables 120 are provided.

The index module 200 transfers the substrates W between the cassettes 20 placed on the mounting tables 120 of the load port 100 and the first buffer module 300. The index module 200 has a frame 210, an index robot 220, and a guide rail 230. The frame 210 has a substantially rectangular parallelepiped shape with an empty space inside and is disposed between the load port 100 and the first buffer module 300. The frame 210 of the index module 200 may have a smaller height than a frame 310 of the first buffer module 300 that will be described below. The index robot 220 and the guide rail 230 are disposed in the frame 210. The index robot 220 has a structure capable of 4-axis driving such that a hand 221 directly handling the substrates W is movable in the first direction 12, the second direction 14, and the third direction 16 and is rotatable. The index robot 220 has the hand 221, an arm 222, a support rod 223, and a base 224. The hand 221 is fixed to the arm 222. The arm 222 is provided in a retractable and rotatable structure. The support rod 223 is disposed such that the lengthwise direction thereof is parallel to the third direction 16. The arm 222 is coupled to the support rod 223 so as to be movable along the support rod 223. The support rod 223 is fixedly coupled to the base 224. The guide rail 230 is disposed such that the lengthwise direction thereof is parallel to the second direction 14. The base 224 is coupled to the guide rail 230 so as to be rectilinearly movable along the guide rail 230. Furthermore, although not illustrated, a door opener for opening/closing doors of the cassettes 20 is additionally provided in the frame 210.

The first buffer module 300 has the frame 310, a first buffer 320, a second buffer 330, a cooling chamber 350, and a first buffer robot 360. The frame 310 has a rectangular parallelepiped shape with an empty space inside and is disposed between the index module 200 and the coating and developing module 400. The first buffer 320, the second buffer 330, the cooling chamber 350, and the first buffer robot 360 are located in the frame 310. The cooling chamber 350, the second buffer 330, and the first buffer 320 are sequentially disposed along the third direction 16 from bottom to top. The first buffer 320 is located at the height corresponding to a coating module 401 of the coating and developing module 400 that will be described below, and the second buffer 330 and the cooling chamber 350 are located at the height corresponding to a developing module 402 of the coating and developing module 400 that will be described below. The first buffer robot 360 is located to be spaced a predetermined distance apart from the second buffer 330, the cooling chamber 350, and the first buffer 320 in the second direction 14.

The first buffer 320 and the second buffer 330 each temporarily store a plurality of substrates W. The second buffer 330 has a housing 331 and a plurality of supports 332. The supports 332 are disposed in the housing 331 and are spaced apart from each other along the third direction 16. One substrate W is placed on each of the supports 332. The housing 331 has openings (not illustrated) that face the directions in which the index robot 220, the first buffer robot 360, and a developer robot 482 are provided, respectively, such that the index robot 220, the first buffer robot 360, and the developer robot 482 of the developing module 402, which will be described below, load the substrates W onto the supports 332 or unload the substrates W from the supports 332. The first buffer 320 has a structure substantially similar to that of the second buffer 330. However, a housing 321 of the first buffer 320 has openings that face the directions in which the first buffer robot 360 and a coater robot 432 located in the coating module 401 are provided, respectively. The number of supports 332 provided in the first buffer 320 may be the same as, or different from, the number of supports 332 provided in the second buffer 330. According to an embodiment, the number of supports 332 provided in the second buffer 330 may be larger than the number of supports 322 provided in the first buffer 320.

The first buffer robot 360 transfers the substrates W between the first buffer 320 and the second buffer 330. The first buffer robot 360 has a hand 361, an arm 362, and a support rod 363. The hand 361 is fixed to the arm 362. The arm 362 has a retractable structure and enables the hand 361 to move along the second direction 14. The arm 362 is coupled to the support rod 363 so as to be rectilinearly movable along the support rod 363 in the third direction 16. The support rod 363 has a length extending from the position corresponding to the second buffer 330 to the position corresponding to the first buffer 320. The support rod 363 may further extend upward or downward. The first buffer robot 360 may be provided such that the hand 361 simply performs only 2-axis driving along the second direction 14 and the third direction 16.

The cooling chamber 350 cools the substrates W. The cooling chamber 350 has a housing 351 and a cooling plate 352. The cooling plate 352 has an upper surface on which the substrate W is placed and a cooling unit 353 that cools the substrate W. Various methods, such as cooling by cooling water, cooling using a thermoelectric element, and the like, may be used for the cooling unit 353. Furthermore, the cooling chamber 350 may include a lift pin assembly (not illustrated) that locates the substrate W on the cooling plate 352. The housing 351 has openings (not illustrated) that face the directions in which the index robot 220 and the developer robot 482 are provided, respectively, such that the index robot 220 and the developer robot 482 provided in the developing module 402 load the substrate W onto the cooling plate 352 or unload the substrate W from the cooling plate 352. In addition, the cooling chamber 350 may include doors (not illustrated) that open or close the openings described above.

The coating and developing module 400 performs a process of coating the substrates W with photoresist before an exposing process and performs a developing process on the substrates W after the exposing process. The coating and developing module 400 has a substantially rectangular parallelepiped shape. The coating and developing module 400 has a coating module 401 and a developing module 402. The coating module 401 and the developing module 402 may be disposed on different floors so as to be divided from each other. According to an embodiment, the coating module 401 is located over the developing module 402.

The coating module 401 performs a process of coating the substrate W with a light-sensitive material such as photoresist and performs a heat treatment process, such as heating or cooling, on the substrate W before and after the photoresist coating process. The coating module 401 has photoresist coating chambers 410, bake units 420, and a transfer chamber 430. The photoresist coating chambers 410, the bake units 420, and the transfer chamber 430 are sequentially disposed along the second direction 14. Accordingly, the photoresist coating chambers 410 and the bake units 420 are spaced apart from each other in the second direction 14, with the transfer chamber 430 therebetween. The photoresist coating chambers 410 are arranged in the first direction 12 and the third direction 16. The drawings illustrate an example that six photoresist coating chambers 410 are provided. The bake units 420 are arranged in the first direction 12 and the third direction 16. The drawings illustrate an example that six bake units 420 are provided. However, a larger number of bake units 420 may be provided.

The transfer chamber 430 is located side by side with the first buffer 320 of the first buffer module 300 in the first direction 12. The coater robot 432 and a guide rail 433 are located in the transfer chamber 430. The transfer chamber 430 has a substantially rectangular shape. The coater robot 432 transfers the substrate W between the bake units 420, the photoresist coating chambers 400, the first buffer 320 of the first buffer module 300, and a first cooling chamber 520 of the second buffer module 500 that will be described below. The guide rail 433 is disposed such that the lengthwise direction thereof is parallel to the first direction 12. The guide rail 433 guides a rectilinear movement of the coater robot 432 in the first direction 12. The coater robot 432 has a hand 434, an arm 435, a support rod 436, and a base 437. The hand 434 is fixed to the arm 435. The arm 435 has a retractable structure and enables the hand 434 to move in the horizontal direction. The support rod 436 is disposed such that the lengthwise direction thereof is parallel to the third direction 16. The arm 435 is coupled to the support rod 436 so as to be rectilinearly movable along the support rod 463 in the third direction 16. The support rod 436 is fixedly coupled to the base 437, and the base 437 is coupled to the guide rail 433 so as to be movable along the guide rail 433.

The photoresist coating chambers 410 all have the same structure. However, the types of photoresists used in the respective photoresist coating chambers 410 may differ from one another. For example, chemical amplification resist may be used as photoresist. Each of the photoresist coating chambers 410 coats the substrate W with photoresist. The photoresist coating chamber 410 has a housing 411, a support plate 412, and a nozzle 413. The housing 411 has a cup shape with an open top. The support plate 412 is located in the housing 411 and supports the substrate W. The support plate 412 is provided so as to be rotatable. The nozzle 413 dispenses the photoresist onto the substrate W placed on the support plate 412. The nozzle 413 may have a circular tubular shape and may dispense the photoresist onto the center of the substrate W. Selectively, the nozzle 413 may have a length corresponding to the diameter of the substrate W, and a dispensing opening of the nozzle 413 may have a slit shape. Additionally, the photoresist coating chamber 410 may further include a nozzle 414 for dispensing a cleaning solution such as deionized water to clean the surface of the substrate W that is coated with the photoresist.

The bake units 420 may perform heat treatment on the substrate W. For example, the bake units 420 perform a prebake process of removing organics or moisture on the surface of the substrate W by heating the substrate W to a predetermined temperature before the substrate W is coated with the photoresist, or perform a soft bake process after the substrate W is coated with the photoresist. In addition, the bake units 420 perform a cooling process of cooling the substrate W after the heating processes.

Figure 5:
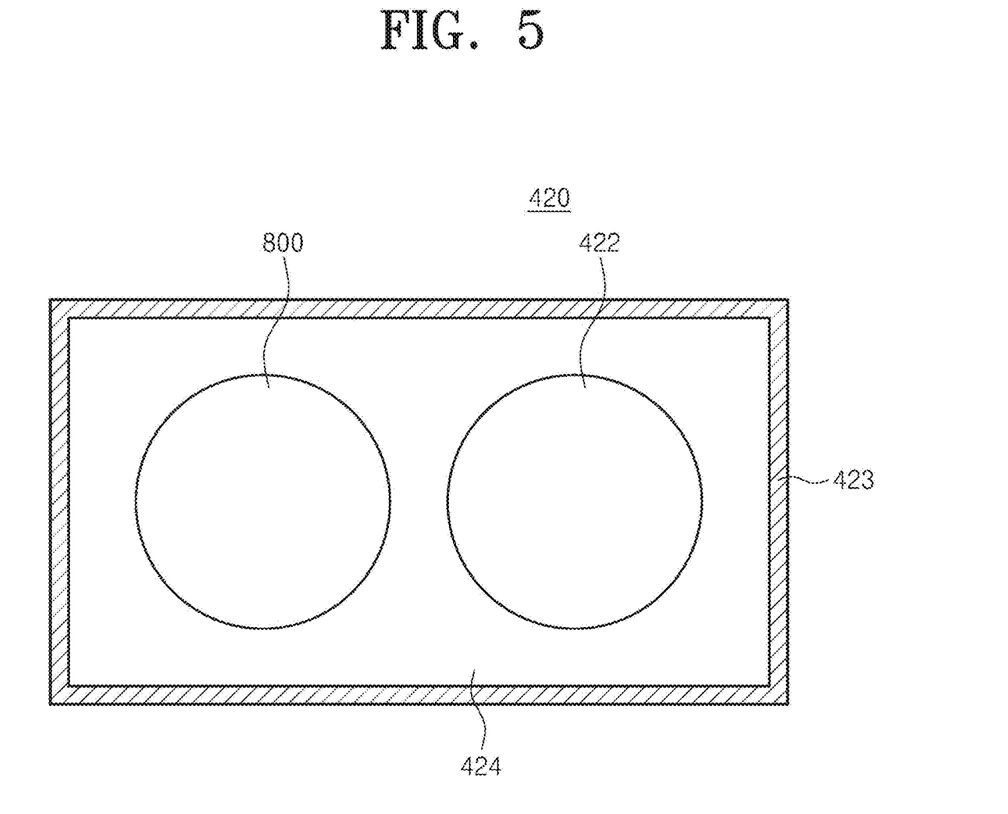
FIG. 5 is a plan view illustrating a bake unit according to an embodiment of the inventive concept.
Figure 6:
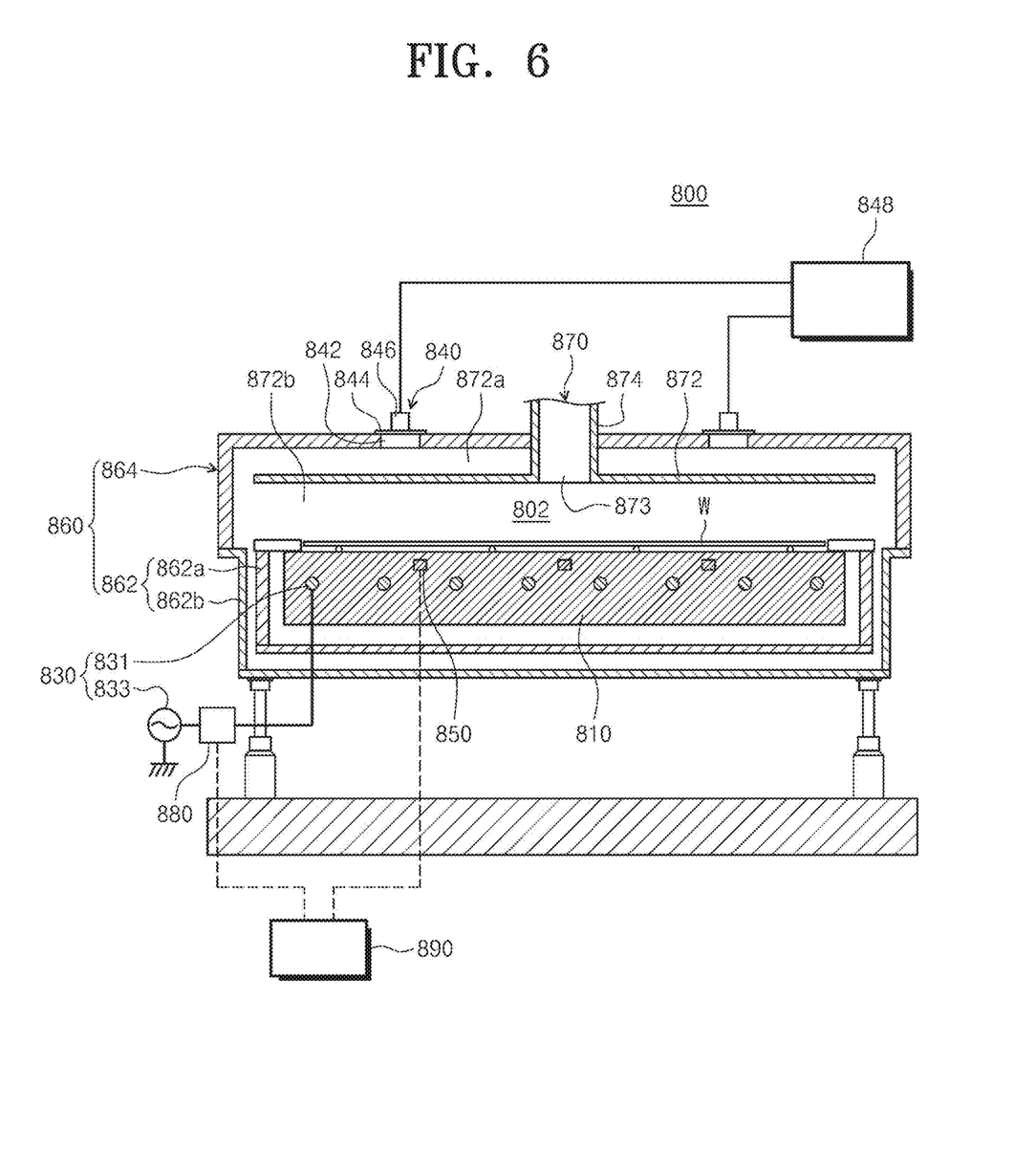
FIG. 6 is a sectional view illustrating a substrate treating apparatus according to an embodiment of the inventive concept.

FIG. 5 is a plan view illustrating the bake unit according to an embodiment of the inventive concept. FIG. 6 is a sectional view illustrating a substrate treating apparatus for performing a heating process in the bake unit of FIG. 5.

Referring to FIGS. 5 and 6, the bake unit 420 may include a process chamber 423, a cooling plate 422, and the substrate treating apparatus 800.

The process chamber 423 has a heat treatment space 424 therein. The process chamber 423 may have a rectangular parallelepiped shape. The cooling plate 422 may cool the substrate W heated by the substrate treating apparatus 800.

The cooling plate 422 may be located in the heat treatment space 424. The cooling plate 422 may have a circular plate shape. A cooling means, such as cooling water or a thermoelectric element, is provided inside the cooling plate 422. For example, the cooling plate 422 may cool the heated substrate W to room temperature.

The substrate treating apparatus 800 treats the substrate W. The substrate treating apparatus 800 may include a housing 860, a plate 810, a heating unit 830, an external gas supply unit 840, a main temperature sensor 850, an auxiliary temperature sensor 880, and an abnormality detection unit 890.

The housing 860 has a treatment space 802 in which a heating process is performed on the substrate W. The housing 860 includes a lower body 862, an upper body 864, and an actuator (not illustrated).

The lower body 862 may have the shape of a container that is open at the top. The plate 810 and the heating unit 830 are located in the lower body 862. The lower body 862 includes double heat-insulating covers 862a and 862b to prevent thermal deformation of apparatuses around the plate 810. The double heat-insulating covers 862a and 862b minimize exposure of the apparatuses around the plate 810 to high-temperature heat generated from the heating unit 830. The double heat-insulating covers 862a and 862b include the primary heat-insulating cover 862a and the secondary heat-insulating cover 862b. The primary heat-insulating cover 862a and the secondary heat-insulating cover 862b are spaced apart from each other.

The upper body 864 has the shape of a container that is open at the bottom. The upper body 864 is combined with the lower body 862 to form the treatment space 802 inside. The upper body 864 has a larger diameter than the lower body 862. The upper body 864 is located over the lower body 862. The upper body 864 is movable in the vertical direction by the actuator. The upper body 864 is vertically movable to a raised position and a lowered position. Here, the raised position is a position where the upper body 864 is separated from the lower body 862, and the lowered position is a position where the upper body 864 is brought into contact with the lower body 862. In the lowered position, the gap between the upper body 864 and the lower body 862 is blocked. Accordingly, when the upper body 864 is moved to the lowered position, the treatment space 802 is formed by the upper body 864, the lower body 862, and the plate 810.

Although not illustrated, sealing members for preventing introduction of external air into the treatment space 802 may be included in the housing 860. For example, the sealing members may seal the gap between the lower body 862 and the upper body 864.

The plate 810 is located in the treatment space 802. The plate 810 has a circular plate shape. An upper surface of the plate 810 serves as a support area on which the substrate W is placed. The plate 810 has a plurality of pin holes 812 formed in the upper surface thereof. For example, three pin holes 812 may be provided. The pin holes 812 are located to be spaced apart from each other along the circumferential direction of the plate 810. The pin holes 812 are located to be spaced apart from each other at constant intervals. Lift pins (not illustrated) are provided in the pin holes 812, respectively. The lift pins are movable in the vertical direction by a drive member (not illustrated).

The heating unit 830 heats the substrate W placed on the plate 810 to a preset temperature. The heating unit 830 may include a plurality of heating wires 831 provided in different areas of the plate 810 and a power supply 833. The heating unit 830 may perform heat treatment on respective areas of the substrate W by using the heating wires 831.

The main temperature sensor 850 directly measures temperatures of the plate 810. The main temperature sensor 850 may include a temperature sensor provided inside the plate 810 or on the plate 810. Furthermore, the main temperature sensor 850 may include a plurality of temperature sensors located in the plurality of areas of the plate 810.

The auxiliary temperature sensor 880 measures temperatures of each of the heating wires 831. Specifically, the auxiliary temperature sensor 880 may measure the temperatures of the heating wire 831 by using electric current flowing through the heating wire 831 and voltage of the power supply 833.

The abnormality detection unit 890 detects an abnormality in the heating wire 831, based on the temperatures of the plate 810 measured by the main temperature sensor 850 and the temperatures of the heating wire 831 measured by the auxiliary temperature sensor 880. Specifically, the abnormality detection unit 890 may determine that the abnormality in the heating wire 831 is detected, when a temperature change characteristic of the heating wire 831 measured by the auxiliary temperature sensor 880 for the temperatures of the plate 810 measured by the main temperature sensor 850 exceed a preset range. For example, when the average of the temperatures of the heating wire 831 measured by the auxiliary temperature sensor 880 exceeds a preset range, the abnormality detection unit 890 may determine that the abnormality in the heating wire 831 is detected. That is, when the heating wire 831 has a preset normal temperature range of 100 degrees Celsius to 120 degrees Celsius and the average of the temperatures of the heating wire 831 measured by the auxiliary temperature sensor 880 is lower than 100 degrees Celsius or higher than 120 degrees Celsius, the abnormality detection unit 890 may determine that the abnormality in the heating wire 831 is detected. In another example, when the standard deviation of the temperatures of the heating wire 831 measured by the auxiliary temperature sensor 880 exceeds a preset range, the abnormality detection unit 890 may determine that the abnormality in the heating wire 831 is detected. The abnormality detection unit 890 may detect at least one of deformation of the heating wires 831, poor insulation of the heating wires 831, and introduction of noise, based on the temperature change characteristic of the temperatures measured by the auxiliary temperature sensor 880 for the temperatures measured by the main temperature sensor 850. That is, the abnormality detection unit 890 may detect whether there is an abnormality in the heating wires 831, based on the temperature change characteristic of the temperatures measured by the auxiliary temperature sensor 880 for the temperatures measured by the main temperature sensor 850. In addition, the abnormality detection unit 890 may specifically detect what abnormality the heating wire 831 has, based on the temperature change characteristic.

Figure 7:
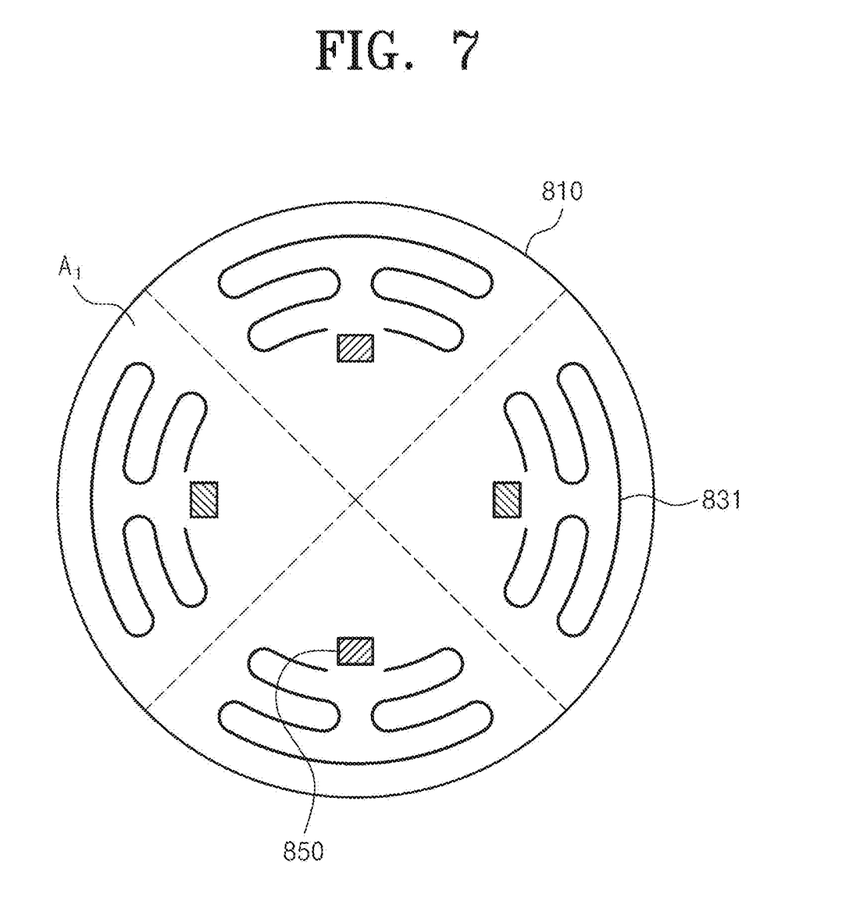
FIG. 7 is a view illustrating an arrangement of heating wires and temperature sensors on a plate according to an embodiment of the inventive concept.

Referring to FIG. 7, the plate 810 according to an embodiment of the inventive concept may be divided into a plurality of areas (e.g., four areas), and the heating wires 831 may be located in the areas of the plate 810, respectively. Furthermore, the main temperature sensor 850 may include a plurality of temperature sensors that are located in the areas of the plate 810, respectively, and the plurality of temperature sensors may measure temperatures of the areas of the plate 810, respectively. The auxiliary temperature sensor 880 may measure temperatures of the heating wires 831 that are located in the areas of the plate 810, respectively. That is, the main temperature sensor 850 and the auxiliary temperature sensor 880 may measure the temperatures of the areas of the plate 810 and the temperatures of the heating wires 831 provided in the areas of the plate 810. The abnormality detection unit 890 may compare the temperature of the heating wire 831 in a specific area among the areas of the plate 810 with the temperatures of the heating wires 831 in the remaining areas to detect an abnormality in the heating wire 831. For example, the abnormality detection unit 890 may determine that an abnormality in the heating wire 831 in a first area A1 is detected, when a difference between the average of temperatures of the heating wire 831 measured by the auxiliary temperature sensor 880 in the first area A1 among the areas of the plate 810 and the average of temperatures of the heating wires 831 measured by the auxiliary temperature sensor 880 in the remaining areas of the plate 810 other than the first area A1 is larger than a preset value. In another example, the abnormality detection unit 890 may determine that an abnormality in the heating wire 831 in the first area A1 is detected, when a difference between the standard deviation of the temperatures of the heating wire 831 measured by the auxiliary temperature sensor 880 in the first area A1 among the areas of the plate 810 and the standard deviation of the temperatures of the heating wires 831 measured by the auxiliary temperature sensor 880 in the remaining areas of the plate 810 other than the first area A1 is larger than a preset value. Furthermore, the abnormality detection unit 890 may predict a failure in each of the heating wires 831 by collecting, for a preset period of time, a temperature change characteristic of temperatures of the heating wire 831 measured by the auxiliary temperature sensor 880 for temperatures of the plate 810 measured by the main temperature sensor 850. For example, the abnormality detection unit 890 may collect the temperature change characteristic for the preset period of time, and when in the collected temperature change characteristic, detection of an abnormality in the heating wire 831 exceeds a predetermined range or exceeds a predetermined number of times, the abnormality detection unit 890 may determine that a failure in the heating wire 831 is predicted. Hereinafter, a method of detecting an abnormality in the heating wire 831 by using a temperature change characteristic of temperatures measured by the auxiliary temperature sensor 880 for temperatures measured by the main temperature sensor 850 will be described in detail with reference to FIGS. 8 to 11.

Figure 8:
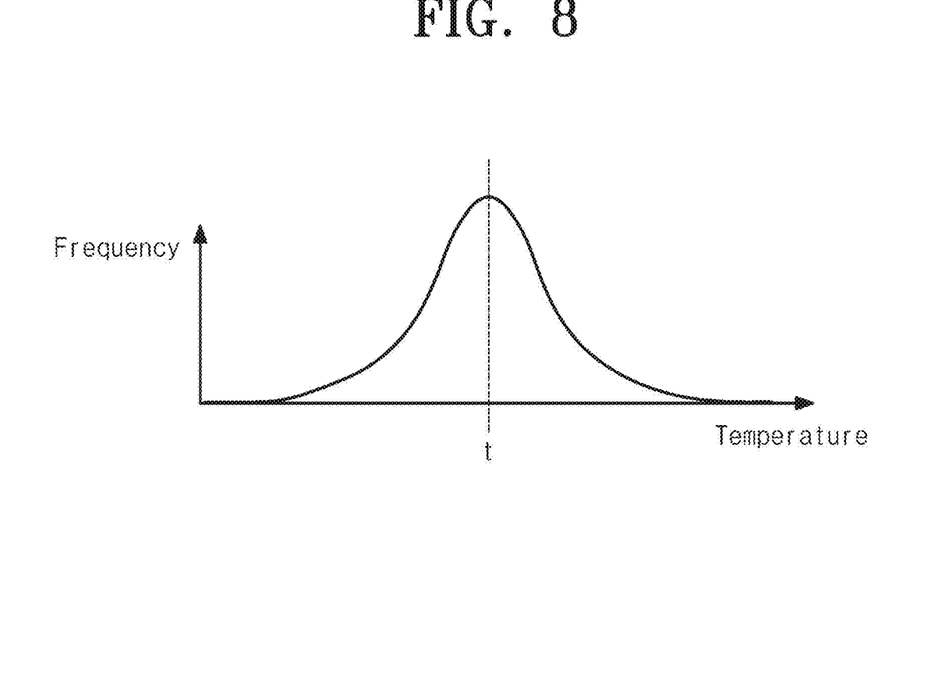
FIGS. 8 to 11 are views illustrating temperature change characteristics of heating wires according to an embodiment of the inventive concept.
Figure 9:
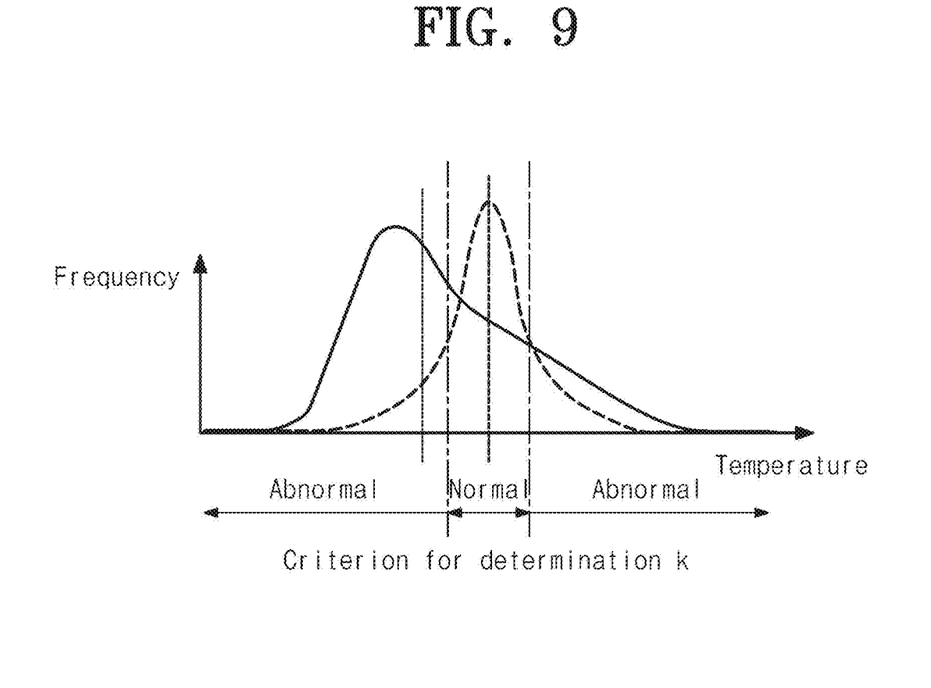
Figure 10:
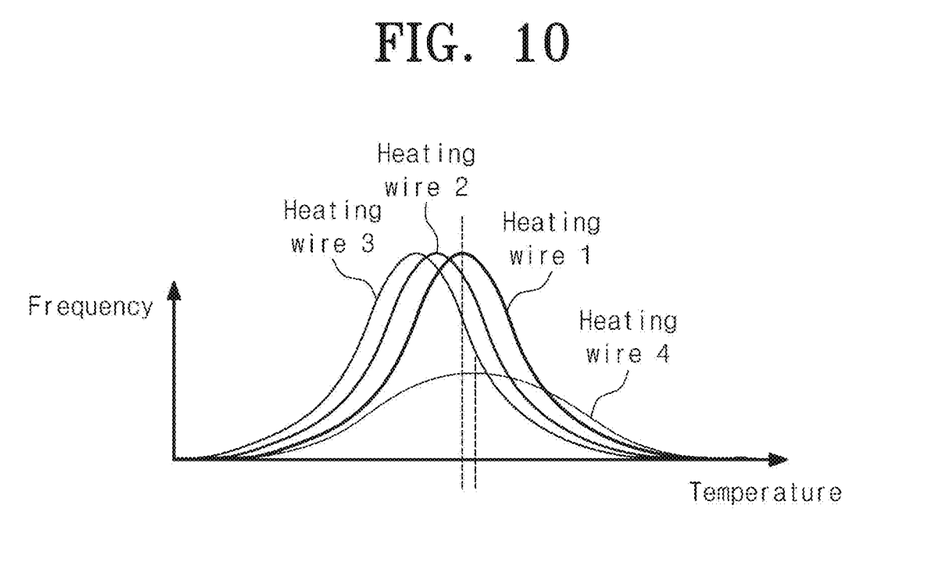

Referring to FIG. 8, the temperature of the plate 810 measured by the main temperature sensor 850 during heat treatment of a substrate has a highest frequency at a specific temperature t, and as the temperature of the plate 810 decreases or increases with respect to the specific temperature t, the measurement frequency of the corresponding temperature gradually decreases. The temperature of the heating wire 831 measured by the auxiliary temperature sensor 880 has the same characteristic as the temperature of the plate 810. That is, characteristics of the temperature of the heating wire 831 measured by the auxiliary temperature sensor 880 for the temperature of the plate 810 measured by the main temperature sensor 850 are proportional to each other. However, when there is an abnormality in the heating wire 831 due to repeated contraction and expansion of the heating wire 831, the characteristics of the temperature of the heating wire 831 for the temperature of the plate 810 may be changed, and the abnormality detection unit 890 of the inventive concept may detect the abnormality in the heating wire 831 by using the characteristics of the temperature of the heating wire 831 for the temperature of the plate 810. Referring to FIG. 9, a temperature change characteristic of the heating wire 831 that corresponds to the temperature change of the plate 810 illustrated in FIG. 8 is within a preset range (e.g., a determination criterion k of FIG. 9) in a normal state. However, if the temperature characteristic of the heating wire 831 measured by the auxiliary temperature sensor 880 is outside the preset range, the abnormality detection unit 890 may determine that an abnormality in the heating wire 831 is detected. For example, when the average of temperatures of the heating wire 831 measured by the auxiliary temperature sensor 880 exceeds a preset range, the abnormality detection unit 890 may determine that an abnormality in the heating wires 831 is detected. In a case where the preset range in FIG. 9 corresponds to a range of 100 degrees Celsius to 120 degrees Celsius, the abnormality detection unit 890 may determine that an abnormality in the heating wire 831 is detected, when the average of the temperatures of the heating wire 831 measured by the auxiliary temperature sensor 880 is lower than 100 degrees Celsius or higher than 120 degrees Celsius. For example, as illustrated in FIG. 10, the auxiliary temperature sensor 880 may measure temperatures of a plurality of heating wires (heating wire 1, heating wire 2, heating wire 3, and heating wire 4) that are located in a plurality of areas of the plate 810, and when the average of the temperatures of each heating wire (e.g., heating wire 4 in FIG. 10) exceeds a preset range, the abnormality detection unit 890 may determine that an abnormality in the corresponding heating wire (e.g., heating wire 4) is detected. In another example, when the standard deviation of the temperatures of each of the heating wires 831 measured by the auxiliary temperature sensor 880 exceeds a preset range, the abnormality detection unit 890 may determine that an abnormality in the heating wire 831 is detected.

Figure 11:
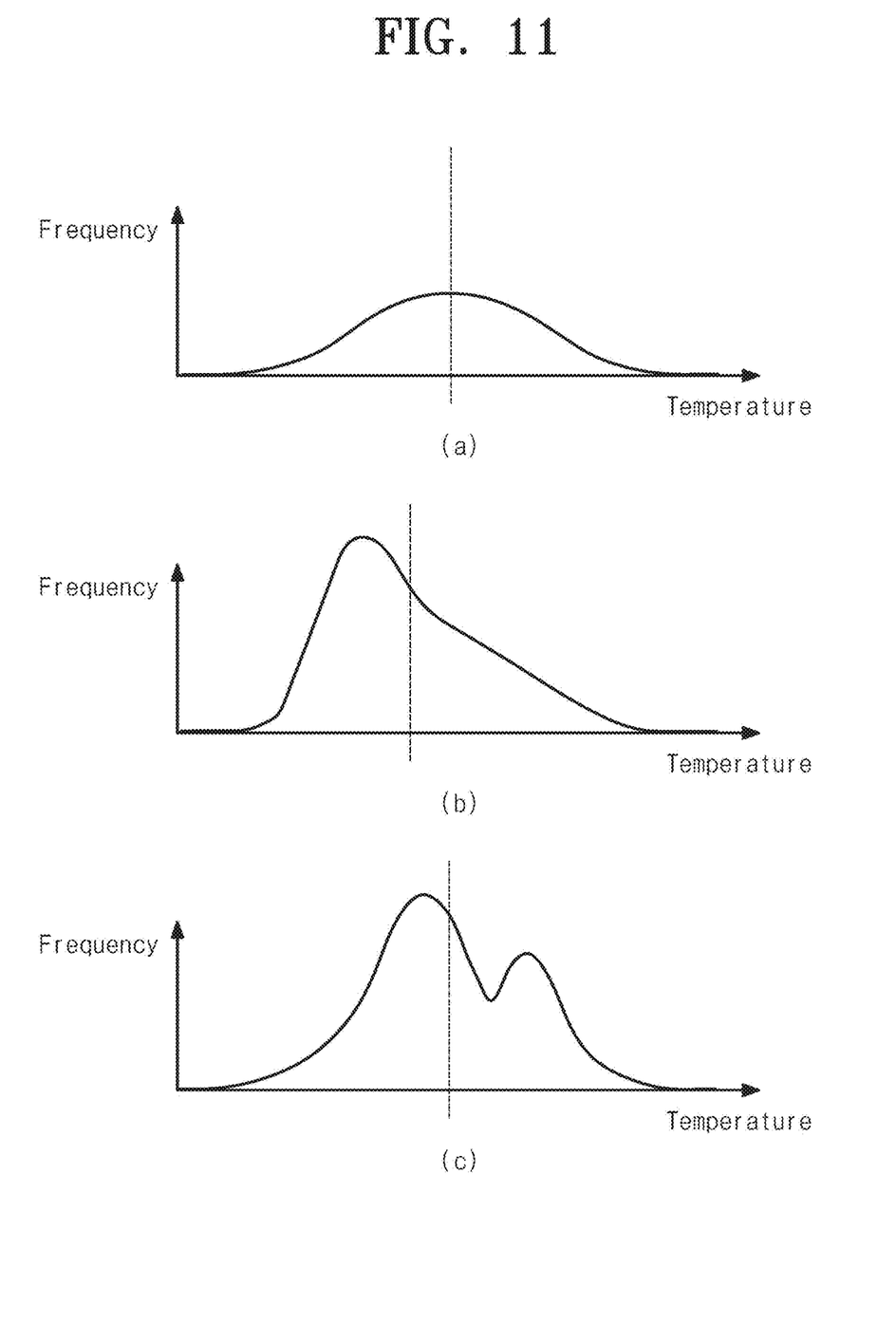

Meanwhile, the abnormality detection unit 890 may detect at least one of deformation of the heating wires 831, poor insulation of the heating wires 831, and introduction of noise, based on a temperature change characteristic of the temperatures of the heating wire 831 measured by the auxiliary temperature sensor 880 for the temperatures of the plate 810 measured by the main temperature sensor 850. Referring to FIG. 11, when a temperature characteristic of the plate 810 measured by the main temperature sensor 850 is provided as illustrated in FIG. 8 and a temperature characteristic of the heating wire 831 measured by the auxiliary temperature sensor 880 is provided as illustrated in FIG. 11 (*a*) (the average being decreased and the standard deviation being increased), the abnormality detection unit 890 may determine that noise is introduced into a signal for controlling the heating wire 831 or the heating wire 831 is deformed. Furthermore, when a temperature characteristic of the heating wire 831 measured by the auxiliary temperature sensor 880 is provided as illustrated in FIG. 11 (*b*) (the average being decreased), the abnormality detection unit 890 may determine that deformation of the heating wire 831 or poor insulation of the heating wire 831 occurs. In addition, when a temperature characteristic of the heating wire 831 measured by the auxiliary temperature sensor 880 is provided as illustrated in FIG. 11 (*c*), the abnormality detection unit 890 may determine that poor insulation of the heating wire 831 occurs or noise is introduced into a signal for controlling the heating wire 831. That is, the inventive concept may detect the type of specific abnormality in the heating wire 831 (deformation, poor insulation, or noise introduction), based on the temperature change characteristic of the temperatures measured by the auxiliary temperature sensor 880 for the temperatures measured by the main temperature sensor 850.

Figure 12:
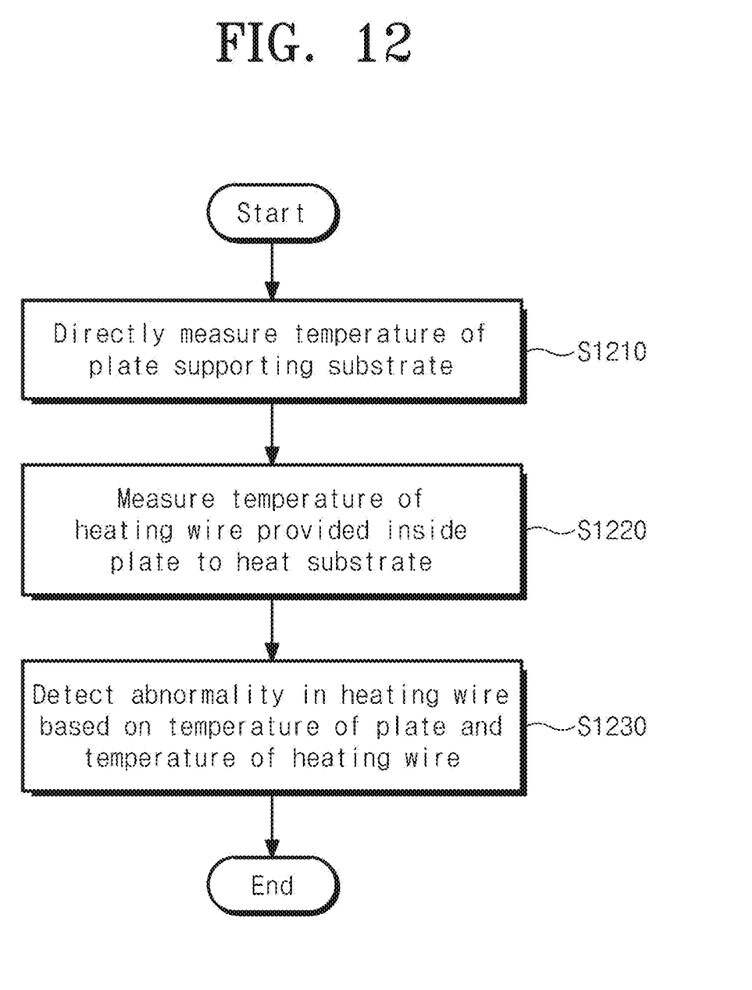
FIG. 12 is a flowchart illustrating a substrate treating method according to an embodiment of the inventive concept.

FIG. 12 is a flowchart illustrating a substrate treating method according to an embodiment of the inventive concept.

Referring to FIG. 12, temperatures of a plate that supports a substrate are directly measured (S1210). Specifically, the temperatures of the plate may be measured by a plurality of temperature sensors provided in a plurality of areas of the plate.

Temperatures of a heating wire that is provided inside the plate and that heats the substrate are measured (S1220). Temperatures of each of a plurality of heating wires located in the plurality of areas of the plate may be measured.

An abnormality in the heating wire is detected based on the temperatures of the plate and the temperatures of the heating wire (S1230). Specifically, when a temperature change characteristic of the heating wire for the temperatures of the plate exceeds a preset range, it may be determined that an abnormality in the heating wire is detected. For example, when the average of the temperatures of the heating wire exceeds a preset range, it may be determined that an abnormality in the heating wire is detected. In another example, when the standard deviation of the temperatures of the heating wire exceeds a preset range, it may be determined that an abnormality in the heating wire is detected. Here, the abnormality in the heating wire may include at least one of deformation of the heating wire, poor insulation of the heating wire, and introduction of noise. Furthermore, when the plurality of heating wires are provided in the plurality of areas of the plate and a difference between the average of temperatures of a heating wire in a first area among the plurality of areas of the plate and the average of temperatures of heating wires in the remaining areas other than the first area among the plurality of areas is larger than a preset value, it may be determined that an abnormality in the heating wire in the first area is detected. Moreover, when a difference between the standard deviation of the temperatures of the heating wire in the first area among the plurality of areas of the plate and the standard deviation of the temperatures of the heating wires in the remaining areas other than the first area among the plurality of areas is larger than a preset value, it may be determined that an abnormality in the heating wire in the first area is detected. In addition, a failure in the heating wire may be predicted by collecting the temperature change characteristic of the heating wire for the temperatures of the plate for a preset period of time.

As described above, according to the various embodiments of the inventive concept, the abnormality in the heating wire may be easily detected by using the temperatures of the plate and the temperatures of the heating wire.

Effects of the inventive concept are not limited to the above-described effects, and any other effects not mentioned herein may be clearly understood from this specification and the accompanying drawings by those skilled in the art to which the inventive concept pertains.

Although the embodiments of the inventive concept have been described above, it should be understood that the embodiments are provided to help with comprehension of the inventive concept and are not intended to limit the scope of the inventive concept and that various modifications and equivalent embodiments can be made without departing from the spirit and scope of the inventive concept. Accordingly, the spirit and scope of the inventive concept should be determined by the technical idea of the claims, and it should be understood that the spirit and scope of the inventive concept is not limited to the literal description of the claims, but actually extends to the category of equivalents of technical value.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a housing having a treatment space therein;
   a plate configured to support the substrate in the housing;
   a heating unit having a heating wire provided inside the plate and configured to heat the substrate;
   a main temperature sensor configured to directly measure temperatures of the plate; and
   an auxiliary temperature sensor configured to measure temperatures of the heating wire.

2. The apparatus of claim 1, further comprising:
   an abnormality detection unit configured to detect an abnormality in the heating wire, based on the temperatures measured by the main temperature sensor and the temperatures measured by the auxiliary temperature sensor.

3. The apparatus of claim 2, wherein the abnormality detection unit determines that the abnormality in the heating wire is detected, when a temperature change characteristic of the temperatures measured by the auxiliary temperature sensor for the temperatures measured by the main temperature sensor exceeds a preset range.

4. The apparatus of claim 3, wherein the abnormality detection unit determines that the abnormality in the heating wire is detected, when an average value of the temperatures measured by the auxiliary temperature sensor exceeds a preset range.

5. The apparatus of claim 3, wherein the abnormality detection unit determines that the abnormality in the heating wire is detected, when a standard deviation of the temperatures measured by the auxiliary temperature sensor exceeds a preset range.

6. The apparatus of claim 3, wherein the abnormality detection unit detects at least one of deformation of the heating wire, poor insulation of the heating wire, and introduction of noise, based on the temperature change characteristic of the temperatures measured by the auxiliary temperature sensor for the temperatures measured by the main temperature sensor.

7. The apparatus of claim 2, wherein the heating wire includes a plurality of heating wires located in a plurality of areas of the plate, respectively,
   wherein the main temperature sensor includes a plurality of temperature sensors located in the plurality of areas of the plate, respectively, and
   wherein the auxiliary temperature sensor measures temperatures of each of the plurality of heating wires located in the plurality of areas of the plate.

8. The apparatus of claim 7, wherein the abnormality detection unit determines that the abnormality in the heating wire is detected in a first area, when a difference between an average value of the temperatures measured by the auxiliary temperature sensor in the first area among the plurality of areas of the plate and an average value of the temperatures measured by the auxiliary temperature sensor in the remaining areas other than the first area among the plurality of areas is larger than a preset value.

9. The apparatus of claim 7, wherein the abnormality detection unit determines that the abnormality in the heating wire is detected in a first area, when a difference between a standard deviation of the temperatures measured by the auxiliary temperature sensor in the first area among the plurality of areas of the plate and a standard deviation of the temperatures measured by the auxiliary temperature sensor in the remaining areas other than the first area among the plurality of areas is larger than a preset value.

10. The apparatus of claim 2, wherein the abnormality detection unit predicts a failure in the heating wire by collecting, for a preset period of time, a temperature change characteristic of the temperatures measured by the auxiliary temperature sensor for the temperatures measured by the main temperature sensor.

11. The apparatus of claim 3, wherein the heating unit includes:
    a heating wire; and
    a power supply configured to apply electric current to the heating wire, and
    wherein the auxiliary temperature sensor measures the temperatures of the heating wire by using the electric current flowing through the heating wire and voltage of the power supply.

12. A method for treating a substrate, the method comprising:
    directly measuring temperatures of a plate configured to support the substrate;
    measuring temperatures of a heating wire provided inside the plate and configured to heat the substrate; and
    detecting an abnormality in the heating wire, based on the temperatures of the plate and the temperatures of the heating wire.

13. The method of claim 12, wherein the detecting of the abnormality in the heating wire includes:
    determining that the abnormality in the heating wire is detected, when a temperature change characteristic of the heating wire for the temperatures of the plate exceeds a preset range.

14. The method of claim 13, wherein the determining that the abnormality in the heating wire is detected includes:
    determining that the abnormality in the heating wire is detected, when an average value of the temperatures of the heating wire exceeds a preset range.

15. The method of claim 13, wherein the determining that the abnormality in the heating wire is detected includes:
    determining that the abnormality in the heating wire is detected, when a standard deviation of the temperatures of the heating wire exceeds a preset range.

16. The method of claim 13, wherein the determining that the abnormality in the heating wire is detected includes:
    detecting at least one of deformation of the heating wire, poor insulation of the heating wire, and introduction of noise, based on the temperature change characteristic of the heating wire for the temperatures of the plate.

17. The method of claim 12, wherein the heating wire includes a plurality of heating wires located in a plurality of areas of the plate, respectively,
    wherein the measuring of the temperatures of the heating wire includes:
    measuring temperatures of each of the plurality of heating wires located in the plurality of areas of the plate, and
    wherein the detecting of the abnormality in the heating wire includes:

determining that the abnormality in the heating wire is detected in a first area, when a difference between an average value of the temperatures of the heating wire in the first area among the plurality of areas of the plate and an average value of the temperatures of the heating wire in the remaining areas other than the first area among the plurality of areas is larger than a preset value.

18. The method of claim 12, wherein the heating wire includes a plurality of heating wires located in a plurality of areas of the plate, respectively, wherein the measuring of the temperatures of the heating wire includes:

measuring temperatures of each of the plurality of heating wires located in the plurality of areas of the plate, and wherein the detecting of the abnormality in the heating wire includes:

determining that the abnormality in the heating wire is detected in a first area, when a difference between a standard deviation of the temperatures of the heating wire in the first area among the plurality of areas of the plate and a standard deviation of the temperatures of the heating wire in the remaining areas other than the first area among the plurality of areas is larger than a preset value.

19. The method of claim 12, further comprising:

predicting a failure in the heating water by collecting a temperature change characteristic of the heating wire for the temperatures of the plate for a preset period of time.

* * * * *